(12) United States Patent
Komatsu et al.

(10) Patent No.: US 12,388,417 B2
(45) Date of Patent: Aug. 12, 2025

(54) ACOUSTIC WAVE FILTER WITH SERIES RESONATOR FOR FILTER STEEPNESS

(71) Applicant: Skyworks Solutions, Inc., Irvine, CA (US)

(72) Inventors: Tomoya Komatsu, Irvine, CA (US); Yiliu Wang, Irvine, CA (US); Jinbaek Song, Pleasanton, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 409 days.

(21) Appl. No.: 17/936,118

(22) Filed: Sep. 28, 2022

(65) Prior Publication Data

US 2023/0096749 A1 Mar. 30, 2023

Related U.S. Application Data

(60) Provisional application No. 63/261,863, filed on Sep. 30, 2021, provisional application No. 63/261,857, filed on Sep. 30, 2021.

(51) Int. Cl.
*H03H 9/56* (2006.01)
*H03H 9/13* (2006.01)
*H03H 9/205* (2006.01)

(52) U.S. Cl.
CPC .............. *H03H 9/568* (2013.01); *H03H 9/13* (2013.01); *H03H 9/205* (2013.01)

(58) Field of Classification Search
CPC .......... H03H 9/568; H03H 9/13; H03H 9/205; H03H 9/02118; H03H 9/02157; H03H 9/605
See application file for complete search history.

(56) References Cited

U.S. PATENT DOCUMENTS

| | | | |
|---|---|---|---|
| 7,474,174 B2 | 1/2009 | Milsom et al. | |
| 9,467,117 B2 | 10/2016 | Fujiwara et al. | |
| 10,979,028 B2 | 4/2021 | Komatsu et al. | |
| 12,334,907 B2 | 6/2025 | Komatsu et al. | |
| 2003/0042995 A1 | 3/2003 | Ella | |
| 2017/0126204 A1 | 5/2017 | Takamine | |
| 2019/0363698 A1* | 11/2019 | Nosaka | H03H 9/725 |
| 2021/0126625 A1 | 4/2021 | Wang et al. | |
| 2021/0159874 A1* | 5/2021 | Yang | H03H 9/568 |
| 2021/0226610 A1 | 7/2021 | Komatsu et al. | |
| 2021/0273630 A1 | 9/2021 | Gupta et al. | |

(Continued)

OTHER PUBLICATIONS

Bell, DeLamar T., and Robert CM Li. "Surface-acoustic-wave resonators." Proceedings of the IEEE 64.5 (1976): 711-721. (Year: 1976).*

(Continued)

*Primary Examiner* — Sharad Rampuria
(74) *Attorney, Agent, or Firm* — Knobbe, Martens, Olson & Bear, LLP

(57) ABSTRACT

Aspects of this disclosure relate to an acoustic wave filter with series bulk acoustic wave resonators. In some embodiments, the acoustic wave filter is a band pass filter having a pass band. One of the series bulk acoustic wave resonators can contribute to forming a lower edge of the pass band. That series bulk acoustic wave resonator can be smaller than another series bulk acoustic wave resonator of the acoustic wave filter.

20 Claims, 15 Drawing Sheets

(56) References Cited

U.S. PATENT DOCUMENTS

2022/0385273 A1* 12/2022 Sun .................... H03H 9/02007
2023/0095556 A1    3/2023 Komatsu et al.

OTHER PUBLICATIONS

Ruppel, Clemens CW, "Acoustic Wave Filter Technology—A Review," IEEE Transactions on Ultrasonics, Ferroelectrics, and Frequency Control, vol. 64, Issue 9, Sep. 2017, pp. 1390-1400.
U.S. Appl. No. 17/936,074 Published as 2023/0095556 A1, Sep. 28, 2022, Acoustic Wave Filter With Shunt Resonator for Filter Steepness.

* cited by examiner

| Fs (MHz) | S1 | S3 | S5 |
|---|---|---|---|
| | 1895 | 1893 | 1895 |
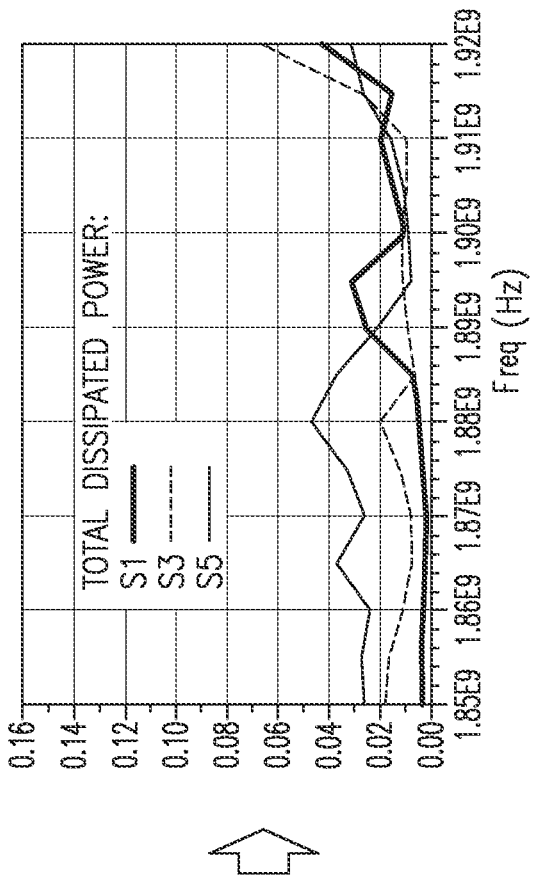
FIG. 6A [REFERENCE]
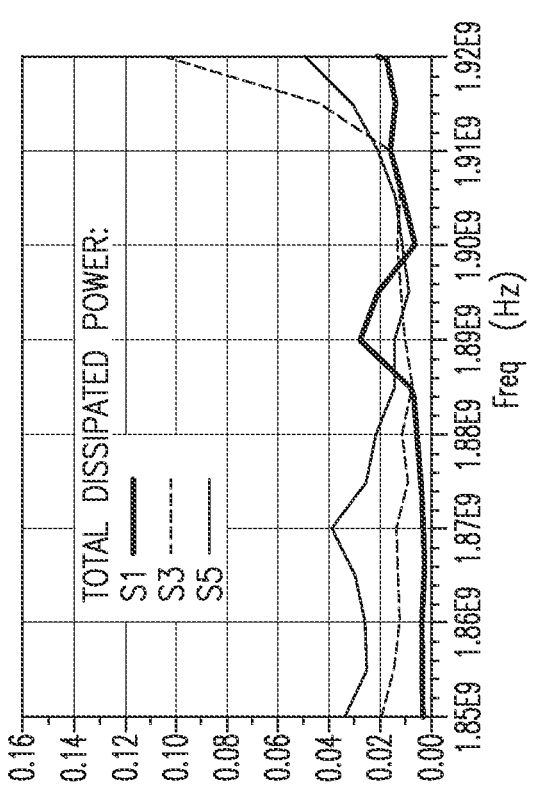
FIG. 6B [NEW]

ACOUSTIC WAVE FILTER WITH SERIES RESONATOR FOR FILTER STEEPNESS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/261,857, filed Sep. 30, 2021 and titled "ACOUSTIC WAVE FILTER WITH SHUNT RESONATOR FOR FILTER STEEPNESS," and U.S. Provisional Application No. 63/261,863, filed Sep. 30, 2021 and titled "ACOUSTIC WAVE FILTER WITH SERIES RESONATOR FOR FILTER STEEPNESS," the disclosures of each of which are hereby incorporated by reference in their entireties and for all purposes.

BACKGROUND

Technical Field

Embodiments of this disclosure relate to acoustic wave filters.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of acoustic resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Certain acoustic wave filters with a steep band edge have encountered weaker power handling near the band edge. Acoustic wave filters with a steep band edge and high power handling near the band edge are generally desirable. However, designing such acoustic wave filters can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter that includes a plurality of series acoustic wave resonators and a plurality of shunt acoustic wave resonators together arranged as a band pass filter with a pass band. The plurality of shunt acoustic wave resonators includes a first bulk acoustic wave resonator and a second bulk acoustic wave resonator. The second bulk acoustic wave resonator is configured to contribute to forming an upper edge of the pass band. The second bulk acoustic wave resonator is smaller than the first bulk acoustic wave resonator.

The first bulk acoustic wave resonator and the second bulk acoustic wave resonator can each include a respective recessed frame. The recessed frame of the second bulk acoustic wave resonator can be wider as percentage of total resonator width than the recessed frame of the first bulk acoustic wave resonator. The first bulk acoustic wave resonator and the second bulk acoustic wave resonator can each include a respective raised frame. The raised frame of the second bulk acoustic wave resonator can be a narrower as a percentage of total resonator width than the raised frame of the first bulk acoustic wave resonator of the first bulk acoustic wave resonator. In some other instances, the first bulk acoustic wave resonator can include a raised frame, and the second bulk acoustic wave resonator can be without a raised frame.

The first bulk acoustic wave resonator and the second bulk acoustic wave resonator can each include a respective recessed frame. The recessed frame of the second bulk acoustic wave resonator can be deeper than the recessed frame of the first bulk acoustic wave resonator. Alternatively or additionally, the raised frame of the second bulk acoustic wave resonator can be narrower as a percentage of total resonator width than the raised frame of the first bulk acoustic wave resonator.

The first bulk acoustic wave resonator and the second bulk acoustic wave resonator can be in parallel with each other in a same filter stage.

A resonant frequency of the second bulk acoustic wave resonator can be higher than a resonant frequency of at least one of the plurality of series acoustic wave resonators. A resonant frequency of the second bulk acoustic wave resonator can be higher than a respective resonant frequency of all of the plurality of series acoustic wave resonators.

The second bulk acoustic wave resonator can increase power ruggedness of the acoustic wave filter in the pass band.

The first bulk acoustic wave resonator can have an area that is at least 1.5 times an area of the second bulk acoustic wave resonator. The first bulk acoustic wave resonator can have an area in a range from 1.5 to 15 times an area of the second bulk acoustic wave resonator.

The second bulk acoustic wave resonator can be a film bulk acoustic wave resonator.

Another aspect of this disclosure is an acoustic wave filter that includes a plurality of series acoustic wave resonators and a plurality of shunt acoustic wave resonators including a first bulk acoustic wave resonator and a second bulk acoustic wave resonator. The second bulk acoustic wave resonator together with at least one of the plurality of series acoustic wave resonators are configured to contribute to forming a skirt of the acoustic wave filter. The second bulk acoustic wave resonator is smaller than the first bulk acoustic wave resonator.

The second bulk acoustic wave resonator can have a wider recessed frame as a percentage of total resonator width than the first bulk acoustic wave resonator.

The first bulk acoustic wave resonator and the second bulk acoustic wave resonator can be in parallel with each other in a same filter stage.

The acoustic wave filter can be a band pass filter having a pass band, and the skirt can correspond to an upper edge of the pass band. Alternatively, the acoustic wave filter can be a band stop filter with a stop band, and the skirt can correspond to a lower edge of the stop band.

The first bulk acoustic wave resonator can have an area in a range from 1.5 to 15 times an area of the second bulk acoustic wave resonator.

Another aspect of this disclosure is a radio frequency module that includes an acoustic wave filter, a radio frequency circuit element coupled to the acoustic wave filter, and a packaging structure enclosing the acoustic wave filter and the radio frequency circuit element. The acoustic wave filter includes a plurality of series acoustic wave resonators and a plurality of shunt acoustic wave resonators together arranged as a band pass filter with a pass band. The plurality of shunt acoustic wave resonators includes a first bulk acoustic wave resonator and a second bulk acoustic wave resonator. The second bulk acoustic wave resonator is configured to contribute to forming an upper edge of the pass band. The second bulk acoustic wave resonator is smaller than the first bulk acoustic wave resonator.

Another aspect of this disclosure is an acoustic wave filter that includes a plurality of shunt acoustic wave resonators and a plurality of series acoustic wave resonators together arranged as a band pass filter with a pass band. The plurality of series acoustic wave resonators includes a first bulk acoustic wave resonator and a second bulk acoustic wave resonator. The second bulk acoustic wave resonator is configured to contribute to forming a lower edge of the pass band. The second bulk acoustic wave resonator is smaller than the first bulk acoustic wave resonator.

The first bulk acoustic wave resonator and the second bulk acoustic wave resonator can each include a raised frame. The raised frame of the second bulk acoustic wave resonator can be wider as a percentage of total resonator width than the raised frame of the first bulk acoustic wave resonator.

The first bulk acoustic wave resonator and the second bulk acoustic wave resonator can each include a recessed frame. The recessed frame of the second bulk acoustic wave resonator can be narrower as a percentage of total resonator width than the recessed frame of the first bulk acoustic wave resonator.

The second bulk acoustic wave resonator can be without a recessed frame.

The first bulk acoustic wave resonator and the second bulk acoustic wave resonator can be in parallel with each other.

A resonant frequency of the second bulk acoustic wave resonator can be lower than the lower edge of the pass band.

The second bulk acoustic wave resonator can be configured to increase power ruggedness of the acoustic wave filter in the pass band.

The first bulk acoustic wave resonator can have an area that is at least 1.5 times an area of the second bulk acoustic wave resonator. The first bulk acoustic wave resonator can have an area in a range from 1.5 to 15 times an area of the second bulk acoustic wave resonator.

The second bulk acoustic wave resonator can be a film bulk acoustic wave resonator.

Another aspect of this disclosure is an acoustic wave filter that includes a plurality of shunt acoustic wave resonators and a plurality of series acoustic wave resonators including a first bulk acoustic wave resonator and a second bulk acoustic wave resonator. The second bulk acoustic wave resonator together with at least one of the plurality of shunt acoustic wave resonators are configured to contribute to forming a skirt of the acoustic wave filter. The second bulk acoustic wave resonator is smaller than the first bulk acoustic wave resonator.

The first bulk acoustic wave resonator and the second bulk acoustic wave resonator can each include a raised frame, and the raised frame of the second bulk acoustic wave resonator can be wider as a percentage of total resonator width than the raised frame of the first bulk acoustic wave resonator. The first bulk acoustic wave resonator and the second bulk acoustic wave resonator can each include a recessed frame, and the recessed frame of the second bulk acoustic wave resonator can be narrower as a percentage of total resonator width than the recessed frame of the first bulk acoustic wave resonator. In some instances, the second bulk acoustic wave resonator does not include a recessed frame.

The first bulk acoustic wave resonator and the second bulk acoustic wave resonator can be in parallel with each other.

The acoustic wave filter can be a band pass filter having a pass band, and the skirt can correspond to a lower edge of the pass band. The second bulk acoustic wave resonator can be configured to increase power ruggedness of the acoustic wave filter in the pass band.

The acoustic wave filter can be a band stop filter with a stop band, and the skirt can correspond to an upper edge of the stop band.

The first bulk acoustic wave resonator can have an area in a range from 1.5 to 15 times an area of the second bulk acoustic wave resonator.

Another aspect of this disclosure is a wireless communication device that includes an acoustic wave filter and an antenna operatively coupled to the acoustic wave. The acoustic wave filter includes a plurality of shunt acoustic wave resonators and a plurality of series acoustic wave resonators together arranged as a band pass filter with a pass band. The plurality of series acoustic wave resonators including a first bulk acoustic wave resonator and a second bulk acoustic wave resonator. The second bulk acoustic wave resonator is configured to contribute to forming a lower edge of the pass band. The second bulk acoustic wave resonator is smaller than the first bulk acoustic wave resonator.

Another aspect of this disclosure is a multiplexer that includes an acoustic wave filter in accordance with any suitable principles and advantages disclosed herein and a second filter coupled to the acoustic wave filter at a common node.

Another aspect of this disclosure is a radio frequency module that includes an acoustic wave filter in accordance with any suitable principles and advantages disclosed herein; a radio frequency circuit element coupled to the acoustic wave filter; and a packaging structure enclosing the acoustic wave filter and the radio frequency circuit element.

Another aspect of this disclosure is a wireless communication device that includes an acoustic wave filter in accordance with any suitable principles and advantages disclosed herein; and an antenna operatively coupled to the acoustic wave filter.

Another aspect of this disclosure is a method of radio frequency filtering. The method includes providing a radio frequency signal to an acoustic wave filter in accordance with any suitable principles and advantages disclosed herein; and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/936,074 titled "ACOUSTIC WAVE FILTER WITH SHUNT RESONATOR FOR FILTER STEEPNESS," filed on even date herewith, the entire disclosure of which is hereby incorporated by reference herein and for all purposes.

BRIEF DESCRIPTION OF THE DRAWINGS

Embodiments of this disclosure will now be described, by way of non-limiting example, with reference to the accompanying drawings.

FIG. 6A is a graph of total dissipated power over frequency for acoustic wave resonators of a ladder filter similar to the acoustic wave filter of FIG. 1. FIG. 6B is a graph of total dissipated power over frequency for acoustic wave resonators of a ladder filter similar to the acoustic wave filter of FIG. 3.

DETAILED DESCRIPTION OF CERTAIN EMBODIMENTS

Figure 2A:
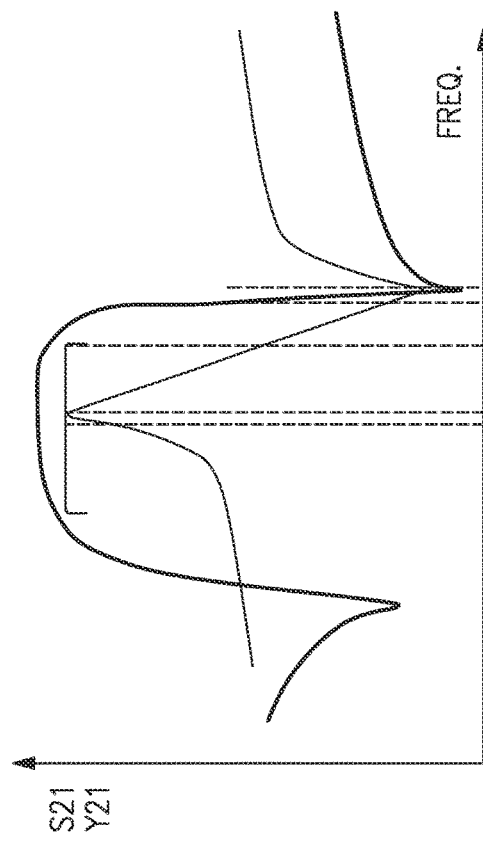
FIGS. 2A and 2B are graphs that indicate a shift in frequency response for an upper edge of a pass band for the acoustic wave filter of FIG. 1.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The skirt of a filter response can be a range of frequencies in which the filter transitions between a pass band and a stop band. The skirt of the filter response can be defined as the region between the cutoff frequency of the pass band and the corner frequency of the stop band. In a band pass filter, a steep filter skirt can contribute to achieving a relatively low insertion loss in a pass band. A steep filter skirt can enable high rejection of frequencies close to and outside of the pass band. High rejection of frequencies close to the pass band and low insertion loss in the pass band are both generally desirable in wireless communications systems.

Certain acoustic wave filters include series acoustic wave resonators with a plurality of different resonant frequencies to create a steep filter skirt at an upper edge of a pass band. For acoustic wave filters with specifications for a steep slope for an upper edge of a pass band, series acoustic wave resonator(s) typically have a desirable electromechanical coupling coefficient ($kt^2$) and a high quality factor (Q) value. One of the series acoustic wave resonators can have a frequency can be at a lowest frequency for making a steep skirt at the upper edge of the pass band. This series acoustic wave resonator can have an anti-resonant frequency that creates an attenuation pole corresponding to the upper edge of the pass band. One or more resonant frequencies of series acoustic wave resonators can be shifted lower, for example, due to increased temperature. The frequency response of acoustic wave resonator(s) of the filter shifting to a lower frequency can degrade power ruggedness at a high channel of the pass band near the upper edge of the pass band.

An acoustic wave filter with a steep skirt that maintains a relatively high power handling capability is desirable for a variety of applications. Embodiments disclosed herein provide technical solutions that can create a steep skirt for an acoustic wave filter and also provide desirable power ruggedness in a channel of the pass band near the steep skirt. In an embodiment, a shunt acoustic wave resonator with a relatively high frequency and small size can be included in parallel with another shunt resonator of an acoustic wave filer. This shunt acoustic wave resonator with a relatively high frequency and small size can create a notch for the acoustic wave filter corresponding to an upper edge of the pass band. With this shunt acoustic wave resonator, the lowest frequency series acoustic wave resonators of the acoustic wave filter can have higher frequencies for improved power handling while the acoustic wave filter has a steep upper edge of the pass band.

Aspects of this disclosure relate to an acoustic wave filter that includes a shunt bulk acoustic wave (BAW) resonator and at least one series acoustic wave resonator that together contribute to forming a skirt of the acoustic wave filter. The shunt BAW resonator is smaller than another shunt BAW resonator. The shunt BAW resonator can have a resonant frequency that is higher than the at least one series acoustic wave resonator. The shunt BAW resonator can create an attenuation pole corresponding to the skirt. The acoustic wave filter can be a band pass filter, and the skirt can correspond to an upper edge of a pass band of the band pass filter. The shunt BAW resonator can increase power ruggedness of the acoustic wave filter in the pass band.

The shunt BAW resonator can have a different frame structure than other shunt BAW resonators of the acoustic wave filter. The shunt BAW resonator have a wider recessed frame than one or more other shunt BAW resonators of the acoustic wave filter. Alternatively or additionally, the shunt BAW resonator have a narrower raised frame than one or more other shunt BAW resonators of the acoustic wave filter. In some instances, the shunt BAW resonator does not include a raised frame.

Aspects of this disclosure relate to an acoustic wave filter that includes a series BAW resonator and at least one shunt acoustic wave resonator that together contribute to forming a skirt of the acoustic wave filter. The series BAW resonator is smaller than another series BAW resonator. The smaller series BAW resonator consumes less physical area than the other series BAW resonator. The acoustic wave filter can be a band pass filter, and the skirt can correspond to a lower edge of a pass band of the band pass filter. The series BAW resonator can have a resonant frequency that is below the lower edge of the pass band.

Example acoustic wave filters will now be discussed. Any suitable principles and advantages of these acoustic wave filters can be implemented together with each other.

Figure 1:
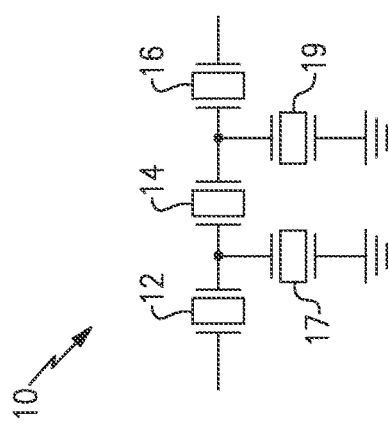
FIG. 1 is a schematic diagram of an acoustic wave filter.

FIG. 1 is a schematic diagram of an acoustic wave filter 10. The acoustic wave filter 10 is a ladder filter. The acoustic wave filter 10 includes series acoustic wave resonators 12, 14, and 16 and shunt acoustic wave resonators 17 and 19. The acoustic wave filter 10 can be a band pass filter with the shunt acoustic wave resonators 17 and 19 having lower resonant frequencies than the series acoustic wave resonators 12, 14, and 16. In the acoustic wave filter 10, the series acoustic wave resonators 12, 14, and 16 can create an upper edge of a pass band and the shunt acoustic wave resonators 17 and 19 can create a lower edge of the pass band. The series acoustic wave resonators 12, 14, and 16 can have different resonant frequencies.

Figure 2B:
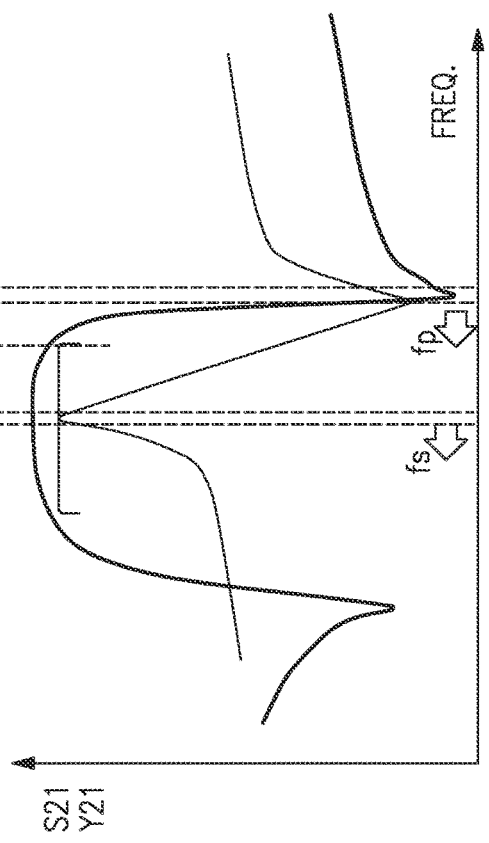

FIGS. 2A and 2B are graphs that indicate a shift in the frequency response of the acoustic wave filter 10 of FIG. 1 for an upper edge of a pass band. FIG. 2A is a graph that illustrates a frequency response of the acoustic wave filter 10 and a frequency response of an individual series acoustic wave resonator 16. The series acoustic wave resonator 16 can have a lowest resonant frequency of the series acoustic wave resonators 12, 14, and 16. The series acoustic wave resonator 16 can have an attenuation pole near the pass band.

In FIG. 2B, the frequency response of the series acoustic wave resonator 16 has been shifted to a lower frequency relative to the frequency response shown in FIG. 2A. As illustrated, both the resonant frequency fs and the anti-resonant frequency fp of the series acoustic wave resonator 16 have been shifted to lower frequencies. The shift in frequency response illustrated in FIG. 2B can be due to an increased temperature and a negative temperature coefficient of frequency (TCF) of the series acoustic wave resonator 16. The shift in frequency in FIG. 2B can create a thermal runway condition in certain applications.

FIG. 2B illustrates that the shift in frequency of the series acoustic wave resonator 16 impacts the upper edge of the pass band of the acoustic wave filter 10. The frequency response of the acoustic wave filter 10 shown in FIG. 2B indicates degraded performance for a high frequency channel of the pass band relative to the frequency response of the acoustic wave filter 10 shown in FIG. 2A. The frequency response of the acoustic wave filter 10 shown in FIG. 2B indicates degraded power ruggedness for the high channel of the pass band relative to the frequency response of the acoustic wave filter 10 shown in FIG. 2A.

Figure 3:
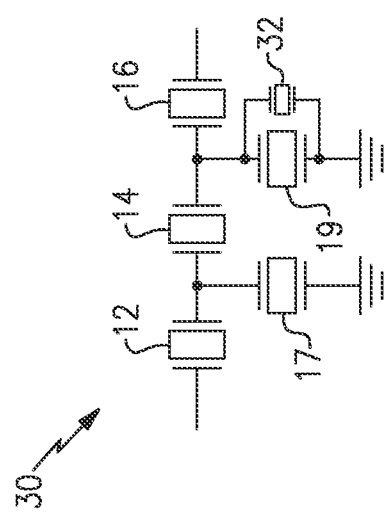
FIG. 3 is a schematic diagram of an acoustic wave filter with a shunt notch resonator according to an embodiment.

FIG. 3 is a schematic diagram of an acoustic wave filter 30 with a shunt notch resonator according to an embodiment. The acoustic wave filter 30 is a ladder filter. The acoustic wave filter 30 can filter a radio frequency signal. As illustrated, the acoustic wave filter 30 includes series acoustic wave resonators 12, 14, and 16, shunt acoustic wave resonators 17 and 19, and a shunt acoustic wave resonator 32 in parallel with the shunt acoustic wave resonator 19. The shunt acoustic wave resonator 32 can be referred to as a shunt notch acoustic wave resonator. The shunt acoustic wave resonator 32 and the shunt acoustic wave resonator 19 are coupled to the series acoustic wave resonators 14 and 16 at the same node in the acoustic wave filter 30. The acoustic wave filter 30 can be a band pass filter with a pass band.

When the acoustic wave filter 30 is a band pass filter, the shunt acoustic wave resonators 17 and 19 typically have lower resonant frequencies than the series acoustic wave resonators 12, 14, and 16. In such a band pass filter, the series acoustic wave resonators 12, 14, and 16 can contribute to forming an upper edge of a pass band and the shunt acoustic wave resonators 17 and 19 can create a lower edge of the pass band.

The shunt acoustic wave resonator 32 has a different frequency than a typical shunt acoustic wave resonator in a band pass filter. The shunt acoustic wave resonator 32 has a higher resonant frequency than one or more of the series acoustic wave resonators 12, 14, and 16. In certain instances, the shunt acoustic wave resonator 32 has a higher resonant frequency than each of the series acoustic wave resonators 12, 14, and 16. The shunt acoustic wave resonator 32 has a resonant frequency that is above an upper edge of the pass band for a band pass acoustic wave filter 30. The shunt acoustic wave resonator 32 can create an attenuation pole near the pass band of the acoustic wave filter 30. With the shunt acoustic wave resonator 32, the operating frequencies of one or more the series acoustic wave resonators 12, 14, and 16 can be shifted higher relative to the acoustic wave filter 10 of FIG. 1 and the acoustic wave filter 30 can create a similarly steep upper edge of the pass band with better power ruggedness and better performance for a high frequency channel of the pass band relative to the acoustic wave filter 10 of FIG. 1.

The shunt acoustic wave resonator 32 can have a TCF that is closer to zero at its resonant frequency fs than the TCF of the series acoustic wave resonators 12, 14, and 16 at their respective anti-resonant frequencies. Accordingly, the shunt acoustic wave resonator 32 can provide temperature compensation benefits, particularly around the upper edge of the pass band. The acoustic wave filter 30 can have less variation in its frequency response in the presence of temperature changes relative to the acoustic wave filter 10.

The shunt acoustic wave resonator 32 can be relatively small in physical size. The shunt acoustic wave resonator 32 can be smaller than the shunt acoustic wave resonator 17. The shunt acoustic wave resonator 32 can consume less physical area than the shunt acoustic wave resonator 17. The shunt acoustic wave resonator 32 can be smaller than the shunt acoustic wave resonator 19. The shunt acoustic wave resonator 19 can have an area that is at least 1.5 times an area of the shunt acoustic wave resonator 32. The shunt acoustic wave resonator 19 can have an area that is in a range from 1.5 times to 15 times an area of the shunt acoustic wave resonator 32.

The shunt acoustic wave resonator 32 can be a BAW resonator. For example, the shunt acoustic wave resonator 32 can be a film bulk acoustic wave resonator (FBAR) or a BAW solidly mounted resonator (SMR). Some or all of the other acoustic wave resonators 12, 14, 16, 17, and 19 can be BAW resonators. A BAW shunt acoustic wave resonator 32 can have a different frame structure than other bulk acoustic wave resonators of the acoustic wave filter 30. For example, a BAW shunt acoustic wave resonator 32 can have a raised frame structure with a sufficiently small width such that a thickness extensional (TE) mode does not significantly degrade steepness of the filter skirt. In some instances, a BAW shunt acoustic wave resonator 32 does not include a raised frame region. As another example, a BAW shunt acoustic wave resonator 32 can have a recessed frame region with a sufficiently large width such that the BAW shunt acoustic wave resonator 32 has a higher Q at resonant frequency fs, without significant spurious modes. A BAW shunt acoustic wave resonator 32 can use a similar stack to series acoustic wave resonators 12, 14, and 16. This can be due a BAW shunt resonator 32 having a resonant frequency that is closer to the series acoustic wave resonators 12, 14, and 16 than the shunt acoustic wave resonators 17 and 19.

In some other applications, the shunt acoustic wave resonator 32 can be a surface acoustic wave (SAW) resonator (e.g., a temperature compensated acoustic wave resonator, a non-temperature compensated acoustic wave resonator, a multilayer piezoelectric substrate acoustic wave resonator), a Lamb wave resonator, a boundary wave resonator, or any other suitable acoustic wave resonator. In such applications, the other acoustic wave resonators 12, 14, 16, 17, and 19 can be any suitable types of acoustic wave resonators, such as BAW resonators, SAW resonators, Lamb wave resonators, boundary wave resonators, or the like. The other acoustic wave resonators 12, 14, 16, 17, and 19 can include at least two different types of acoustic wave resonators in certain applications. When the shunt acoustic wave resonator 32 is a SAW resonator, the resonant frequency can correspond to interdigital transducer (IDT) electrode pitch.

Although the acoustic wave filter 30 includes one shunt notch acoustic wave resonator 32, two or more notch shunt resonators can be implemented in some other applications. Moreover, a shunt notch resonator can be included in parallel with and coupled to series resonators at the same node as any of the shunt acoustic wave resonators of an acoustic wave filter.

Figure 4A:
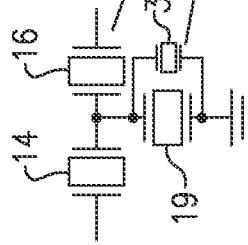
FIG. 4A illustrates a subset of acoustic wave resonators of the acoustic wave filter of FIG. 3.
Figure 4B:
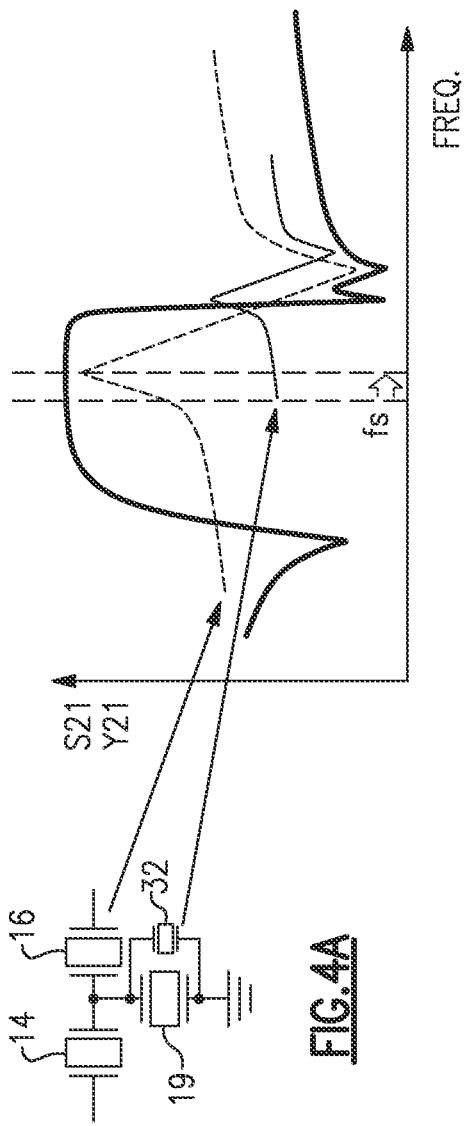
FIG. 4B illustrates a frequency response of the acoustic wave filter of FIG. 3 and certain acoustic wave resonators of the acoustic wave filter.

FIG. 4A is a schematic diagram of part of the acoustic wave filter 30 of FIG. 3. FIG. 4B illustrates a frequency response of the acoustic wave filter 30 of FIG. 3. FIG. 4B also illustrates the frequency responses of acoustic wave resonators 16 and 32 of FIG. 4A.

FIG. 4B illustrates that the resonant frequency fs of the series acoustic wave resonator 16 of the acoustic wave filter 30 is shifted up in frequency relative to the series acoustic wave resonator 16 of the acoustic wave filter 10 of FIG. 1. The anti-resonant frequency of the series acoustic wave resonator 16 is also similarly shifted up in frequency. As shown in FIG. 4B, the shunt acoustic wave resonator 32 has a higher resonant frequency than the series acoustic wave resonator 16. FIG. 4B also shows that the resonant frequency of the shunt acoustic wave resonator 32 is above the upper edges of the pass band of the acoustic wave filter 30. The shunt acoustic wave resonator 32 can create an attenuation pole near the upper edge of the pass band. Relative to the frequency response shown in FIG. 2A, the frequency response of the acoustic wave filter 30 shown in FIG. 4B includes an additional local minimum above the pass band. This additional local minimum can correspond to the anti-resonant frequency of the series acoustic wave resonator 16 being shifted up in frequency above the resonant frequency of the shunt acoustic wave resonator 32.

With the shunt acoustic wave resonator 32 and the shift in frequency of the frequency response of the series acoustic wave resonator 16, the steepness of the upper edge of the pass band shown in FIG. 4B is comparable to the frequency response shown in FIG. 2A and improved relative to the frequency response shown in FIG. 2B. Moreover, the shunt acoustic wave resonator 32 can provide temperature compensation benefits.

Figure 5A:
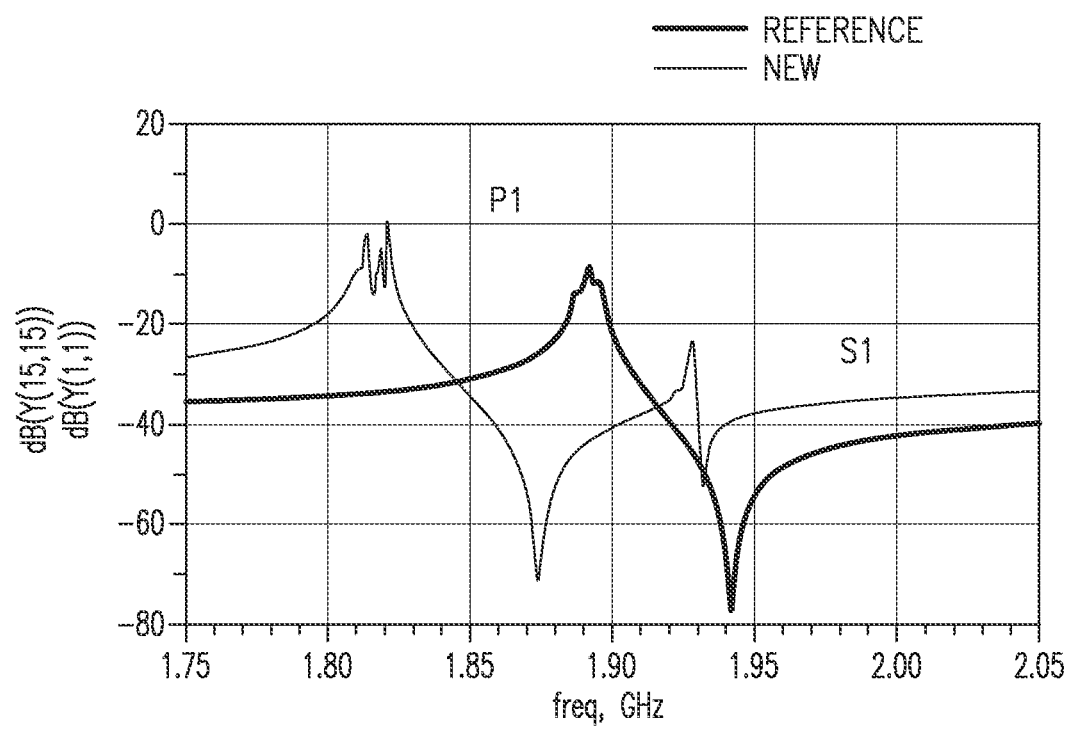
FIG. 5A is a graph that illustrates that an additional pole is created by the shunt notch resonator of FIG. 3.
Figure 5B:
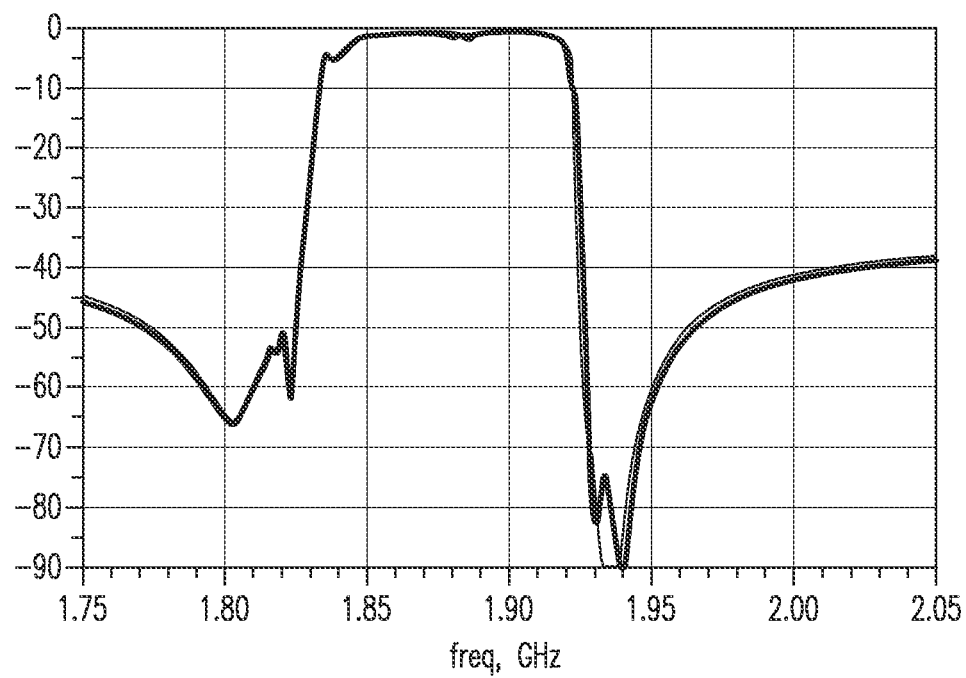
FIG. 5B is a graph illustrating frequency responses of acoustic wave filters similar to the filters of FIGS. 1 and 3.

A ladder filters with 5 series acoustic wave resonators and 4 shunt acoustic wave resonators were simulated, where one of the ladder filters was similar to the acoustic wave filter 10 of FIG. 1 and the other ladder filter was similar to the acoustic wave filter 30 of FIG. 3. FIGS. 5A and 5B illustrate simulation results. In these drawings, the ladder filter similar to the acoustic wave filter 10 has a curve corresponding to Reference in the legend and the ladder filter similar to the acoustic wave filter 30 has a curve corresponding to New in the legend. FIG. 5A illustrates that an additional pole is created by the shunt notch resonator 32 in the ladder filter similar to FIG. 3. FIG. 5B illustrates the simulation results from the two ladder filters for a wider frequency range than shown in FIG. 5A, where the wider frequency range includes the full pass band of each ladder filter.

FIG. 6A is a graph of total dissipated power over frequency for acoustic wave resonators of a ladder filter similar to the acoustic wave filter 10 of FIG. 1, but with 5 series acoustic wave resonators and 4 shunt acoustic wave resonators. FIG. 6B is a graph of total dissipated power over frequency for acoustic wave resonators of a ladder filter similar to the acoustic wave filter 30 of FIG. 3, but with 5 series acoustic wave resonators and 4 shunt acoustic wave resonators and the shunt acoustic wave resonator 32. Total dissipated power over frequency is shown for three series acoustic wave resonators having resonant frequencies of 1895 MHz, 1883 MHz, and 1895 MHz is shown in FIG. 6A. Total dissipated power over frequency is shown for three similar series acoustic wave resonators having resonant frequencies shifted up is shown in FIG. 6B.

FIGS. 6A and 6B indicate that total dissipated power of acoustic wave resonators is reduced for the acoustic wave filter corresponding to FIG. 6B. This can be due to the increase in resonant frequency of series acoustic wave resonators associated with including a shunt acoustic wave resonator 32. The acoustic wave resonator with the lowest resonant frequency has a significant decrease in dissipated power in FIG. 6B relative to FIG. 6A. FIG. 6B also indicates improved power ruggedness relative to FIG. 6A.

Although some embodiments are described with reference to a band pass filter, any suitable principles and advantages disclosed herein can be applied to a band rejection filter. In a band rejection filter, a notch shunt acoustic wave resonator can be implemented to provide a steep skirt at the lower side of the rejection band. The notch shunt acoustic wave resonator can have a higher resonant frequency than series acoustic wave resonators of the band rejection filter. The resonant frequency of the notch shunt acoustic wave resonator can be above the lower edge of the rejection band of the band rejection filter. The notch shunt resonator can be implemented in accordance with any suitable principles and advantages of the shunt acoustic wave resonator 32 disclosed herein.

In certain applications, a series notch resonator can be included in parallel with a series acoustic wave resonator in an acoustic wave filter. The series notch resonator can contribute to forming a steep filter skirt. For example, the series notch resonator can contribute to forming a steep lower edge of a pass band of a band pass filter. With the series notch resonator, an acoustic wave filter can implement desirable power ruggedness in a lower frequency channel of the pass band. In addition, there can be less variation in the lower edge of the pass band as temperature changes in such a filter.

Figure 7:
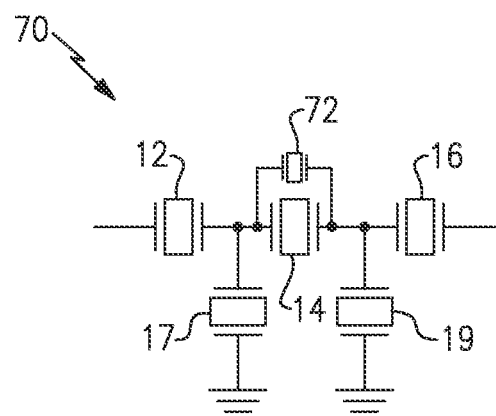
FIG. 7 is a schematic diagram of an acoustic wave filter with a series notch resonator according to an embodiment.

FIG. 7 is a schematic diagram of an acoustic wave filter 70 with a series notch resonator according to an embodiment. The acoustic wave filter 70 is a ladder filter. The acoustic wave filter 70 can filter a radio frequency signal. As illustrated, the acoustic wave filter 70 includes series acoustic wave resonators 12, 14, and 16, shunt acoustic wave resonators 17 and 19, and a series acoustic wave resonator 72 in parallel with the series acoustic wave resonator 14. The series acoustic wave resonator 72 can be referred to as a series notch acoustic wave resonator. The acoustic wave filter 70 can be a band pass filter with a pass band.

When the acoustic wave filter 70 is a band pass filter, the shunt acoustic wave resonators 17 and 19 typically have lower resonant frequencies than the series acoustic wave resonators 12, 14, and 16. In such a band pass filter, the series acoustic wave resonators 12, 14, and 16 can create an upper edge of a pass band and the shunt acoustic wave resonators 17 and 19 can contribute to forming a lower edge of the pass band.

The series acoustic wave resonator 72 has a different frequency than a typical series acoustic wave resonator in a band pass filter. The series acoustic wave resonator 72 has a resonant frequency that is lower than a lower edge of the pass band. The series acoustic wave resonator 72 can create an attenuation pole near the pass band of the acoustic wave filter 70. With the series acoustic wave resonator 72, the operating frequencies of one or more the shunt acoustic wave resonators 17 and 19 can be shifted lower relative to the acoustic wave filter 10 of FIG. 1 and the acoustic wave filter 70 can create a similarly steep lower edge of the pass band with better power ruggedness and better performance for a low channel of the pass band relative to the acoustic wave filter 10 of FIG. 1.

The series acoustic wave resonator 72 can have a TCF that is closer to zero at its resonant frequency fs than the TCF of the shunt acoustic wave resonators 17 and 19 at their respective anti-resonant frequencies. Accordingly, the series acoustic wave resonator 72 can provide temperature compensation benefits, particularly around the lower edge of the pass band. The acoustic wave filter 70 can have less variation in its frequency response around the lower edge of the pass band in the presence of temperature changes relative to the acoustic wave filter 10.

The series acoustic wave resonator 72 can be relatively small in physical size. The series acoustic wave resonator 72 can be smaller than the series acoustic wave resonator 14. The series acoustic wave resonator 72 can consume less physical area than the series acoustic wave resonator 14. The series acoustic wave resonator 72 can be smaller than each of the other series acoustic wave resonators 12 and 16. The series acoustic wave resonator 14 can have an area that is at least 1.5 times an area of the series acoustic wave resonator 72. The series acoustic wave resonator 14 can have an area that is in a range from 1.5 times to 15 times an area of the series acoustic wave resonator 72.

The series acoustic wave resonator 72 can be a BAW resonator. For example, the series acoustic wave resonator 72 can be an FBAR or a BAW SMR. Some or all of the other acoustic wave resonators 12, 14, 16, 17, and 19 can be BAW resonators. A BAW series acoustic wave resonator 72 can have a different frame structure than other BAW resonators of the acoustic wave filter 70. For example, a BAW series acoustic wave resonator 72 can have raised frame region sufficiently wide to boost Qp. A BAW series resonator 72 can have a wider raised frame region than another BAW series resonator of the acoustic wave filter 70, such as a BAW series resonator 14. A BAW series resonator 72 can have a relatively narrow and/or shallow recessed frame region. In some instances, a BAW series resonator 72 can be without a recessed frame region. Without a recessed frame region, the Qp of a BAW series resonator 72 can be increased relative to a similar BAW resonator with a recessed frame region. A BAW series resonator 72 can have a narrower and/or less deep recessed frame region than another BAW series resonator of the acoustic wave filter 70, such as a BAW series resonator 14. A BAW series acoustic wave resonator 72 can use a similar stack to shunt acoustic wave resonators 17 and 19. This can be due a BAW series resonator 72 having a resonant frequency that is closer to the shunt acoustic wave resonators 17 and 19 than the series acoustic wave resonators 12, 14, and 16.

In some other applications, the series acoustic wave resonator 72 can be a surface SAW resonator (e.g., a temperature compensated acoustic wave resonator, a non-temperature compensated acoustic wave resonator, a multi-layer piezoelectric substrate acoustic wave resonator), a Lamb wave resonator, a boundary wave resonator, or any other suitable acoustic wave resonator. In such applications, the other acoustic wave resonators 12, 14, 16, 17, and 19 can be any suitable types of acoustic wave resonators, such as BAW resonators, SAW resonators, Lamb wave resonators, boundary wave resonators, or the like. The other acoustic wave resonators 12, 14, 16, 17, and 19 can include at least two different types of acoustic wave resonators in certain applications.

Although the acoustic wave filter 70 includes one series notch acoustic wave resonator 72, two or more notch series resonators can be implemented in some other applications. Moreover, a series notch resonator can be included in parallel with any of the series acoustic wave resonators of an acoustic wave filter.

In certain applications, an acoustic wave filter can include one or more series notch acoustic wave resonators in accordance with any suitable principles and advantages disclosed herein and one or more shunt notch acoustic wave resonators in accordance with any suitable principles and advantages disclosed herein.

Figure 8A:
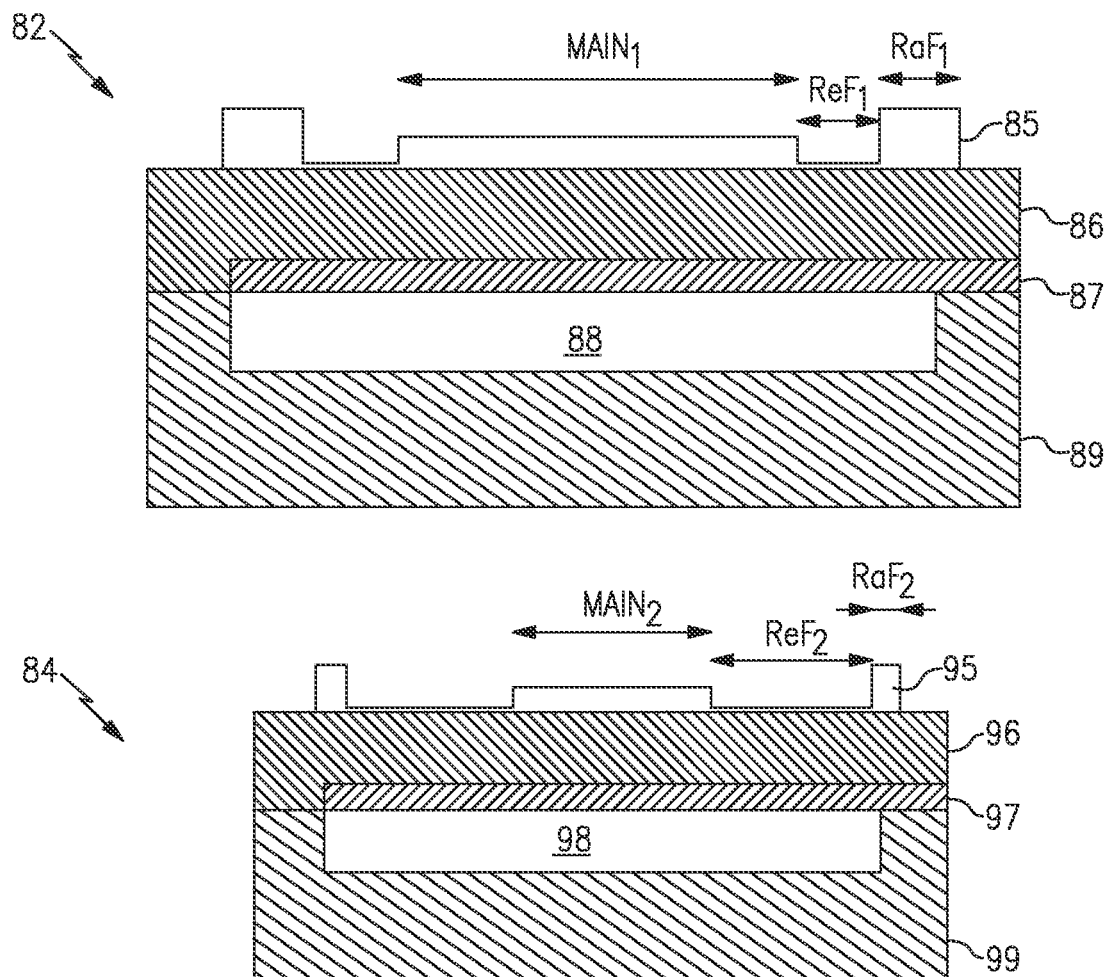
FIG. 8A illustrates two bulk acoustic wave (BAW) resonators that can be in parallel with each other in a filter according to an embodiment.

FIG. 8A illustrates cross sectional schematic diagrams of two BAW resonators 82 and 84 that can be shunt resonators in parallel with each other in a filter according to an embodiment. For example, a first BAW resonator 82 can correspond to the shunt acoustic wave resonator 19 of FIG. 3, and a second BAW resonator 84 can correspond to the shunt acoustic wave resonator 32 of FIG. 3. The second BAW resonator 84 is smaller than the first BAW resonator 82. The second BAW resonator 84 consumes less physical area than the first BAW resonator 82. The second BAW resonator 84 also includes a different frame structure than the first BAW resonator 82.

As illustrated, the first BAW resonator 82 includes an upper layer stack 85, a piezoelectric layer 86, a lower electrode 87, an air cavity 88, and a support substrate 89. The upper layer stack 85 provides different mass loading in a main acoustically active region $MAIN_1$, a recessed frame region $ReF_1$, and a raised frame region $RaF_1$ of the first BAW resonator 82. There is more mass loading in the raised frame region $RaF_1$ than in the main acoustically active region $MAIN_1$. There is less mass loading in the recessed frame region $ReF_1$ than in the main acoustically active region $MAIN_1$. The upper layer stack 85 can include at least an upper electrode and a passivation layer. The upper electrode can have a thickness that is the same or similar as the lower electrode 87. Although different mass loading is provided in different regions of the first BAW resonator 82 by the upper layer stack 85 in FIG. 8A, one or more other layers embedded in a piezoelectric layer and/or below a piezoelectric layer can alternatively or additionally contribute to different mass loading in different regions of a BAW resonator.

As also illustrated in FIG. 8A, the second BAW resonator 84 includes an upper layer stack 95, a piezoelectric layer 96, a lower electrode 97, an air cavity 98, and a support substrate 99. The BAW resonators 82 and 84 can be on a common die. The upper layer stack 95 provides different mass loading in a main acoustically active region $MAIN_2$, a recessed frame region $ReF_2$, and a raised frame region $RaF_2$ of the second BAW resonator 84. The upper layer stack 95 can include at least an upper electrode and a passivation layer. The upper electrode can have a thickness that is the same or similar as the lower electrode 97. Although different mass loading is provided in different regions of the second BAW resonator 84 by the upper layer stack 95 in FIG. 8A, one or more other layers embedded in a piezoelectric layer and/or below a piezoelectric layer can alternatively or additional contribute to different mass loading in different regions of a BAW resonator.

The recessed frame region $ReF_2$ of the second BAW resonator 84 is wider than the recessed frame region $ReF_1$ of the first BAW resonator 82. The recessed frame region $ReF_2$ of the second BAW resonator 84 occupies a greater percentage of the total resonator width of the second BAW resonator 84 than the recessed frame region $ReF_1$ occupies of total resonator width of the first BAW resonator 82. The recessed frame region $ReF_2$ is a larger percentage of total resonator width of the second BAW resonator 84 than the recessed frame region $ReF_1$ is of total resonator width of the first BAW resonator 82. For example, the recessed frame region $ReF_2$ covers a larger percentage of the air cavity 98 than the recessed frame region $ReF_1$ covers of the air cavity 88. The recessed frame region $ReF_2$ can have a greater depth relative to the main region $Main_2$ of the second BAW resonator 84 compared to a depth of the recessed frame region $ReF_1$ to relative to the main region $Main_2$ in the first BAW resonator 82. The recessed frame region $ReF_2$ of the second BAW resonator 84 can have a sufficiently large width and/or depth such that the second BAW resonator 84 has a higher Q at resonant frequency fs without significant spurious modes. The recessed frame region $ReF_2$ of the second BAW resonator 84 can suppress lateral modes for the second BAW resonator 84. The combination of width and depth of the recessed frame region $ReF_2$ in the second BAW resonator 84 can provide desirable lateral mode suppression and/or Q.

The raised frame region $RaF_2$ of the second BAW resonator 84 is narrower than the raised frame region $RaF_1$ of the first BAW resonator 82. The raised frame region $RaF_2$ is a smaller percentage of total resonator width of the second BAW resonator 84 than the raised frame region $RaF_1$ is of total resonator width of the first BAW resonator 82. With a narrow raised frame region $RaF_2$, strong TE modes can be avoided. The raised frame region $RaF_2$ of the second BAW resonator 84 can be sufficiently narrow such that a TE mode does not significantly degrade steepness of a filter skirt. In some instances, a narrow raised frame region $RaF_2$ of the second BAW resonator 84 is less than 0.4 um wide. A notch bulk acoustic wave resonator can be without a raised frame raised frame region, for example, as discussed with reference to FIG. 8B.

Figure 8B:
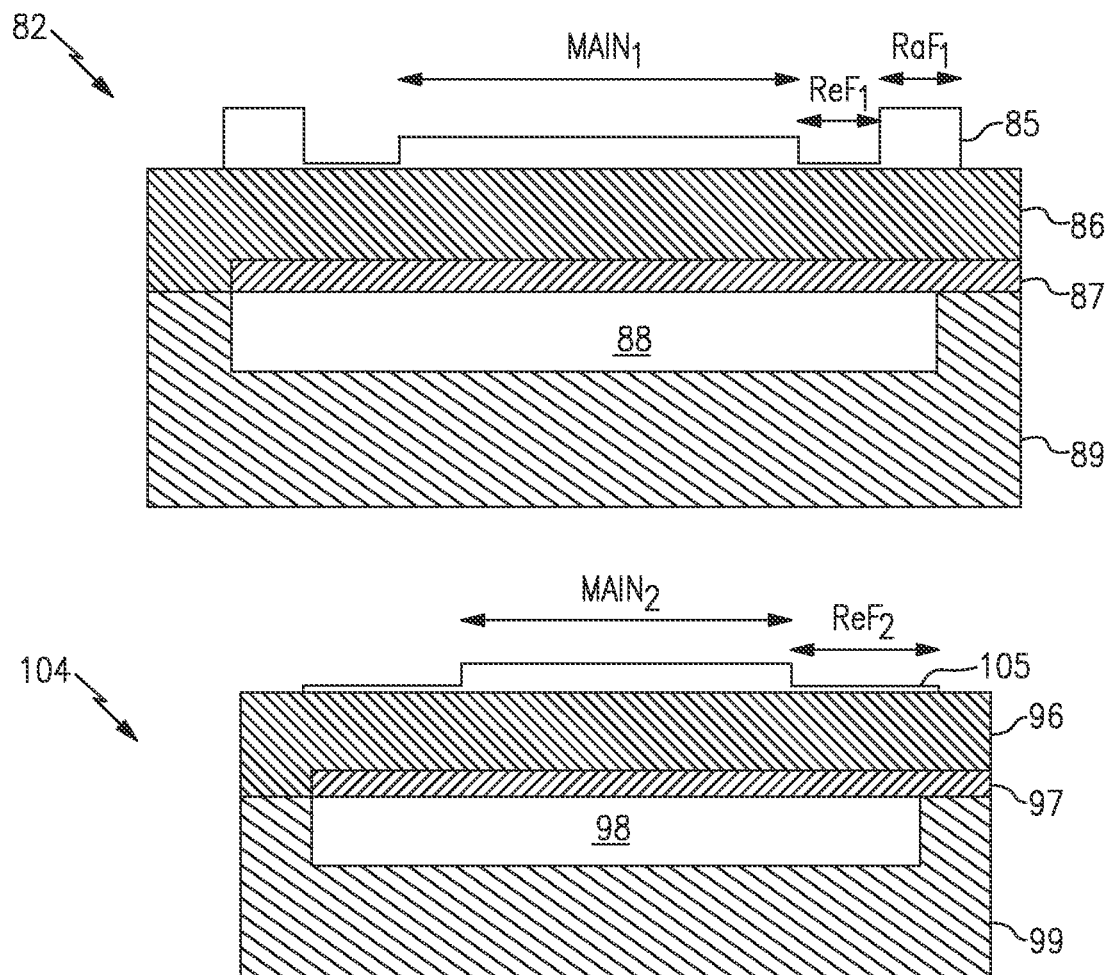
FIG. 8B illustrates two BAW devices that can be in parallel with each other in a filter according to another embodiment.

FIG. 8B illustrates a cross sectional schematic view two BAW resonators 82 and 104 that can be shunt resonators in parallel with each other in a filter according to another embodiment. For example, a first BAW resonator 82 can correspond to the shunt acoustic wave resonator 19 of FIG. 3, and a second BAW resonator 104 can correspond to the shunt acoustic wave resonator 32 of FIG. 3. The second BAW resonator 104 is smaller than the first BAW resonator 82. The second BAW resonator 104 consumes less physical area than the first BAW resonator 82. The second BAW resonator 104 also includes a different frame structure than the first BAW resonator 82. The second BAW resonator 104 is free from a raised frame structure. The second BAW resonator 104 is similar to the second BAW resonator 84 of FIG. 8A, except that the second BAW resonator 104 does not include a raised frame region. As illustrated, the second BAW resonator 104 includes an upper layer stack 105. The upper layer stack 105 provides different mass loading in a main acoustically active region $MAIN_2$ and a recessed frame region $ReF_2$.

Figure 9:
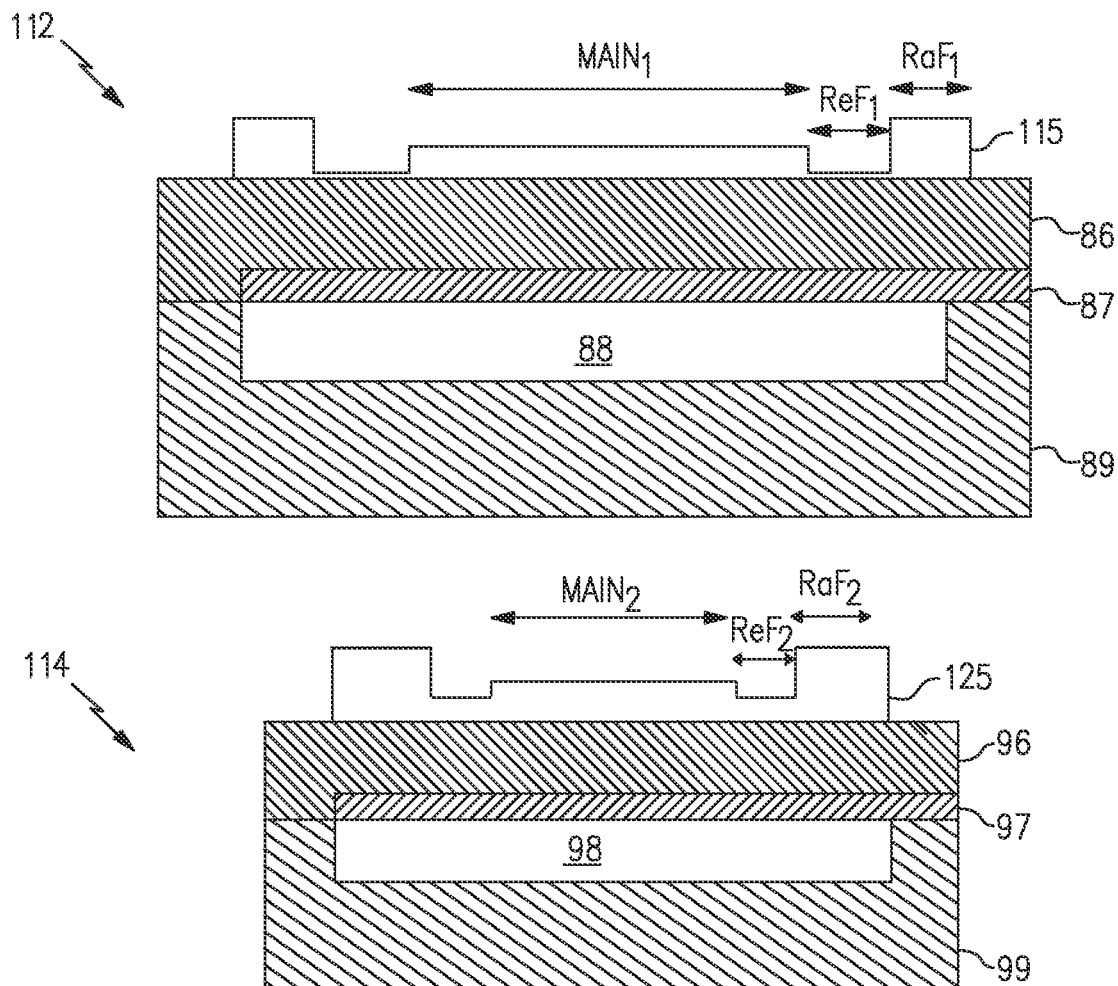
FIG. 9 illustrates two BAW resonators that can be shunt resonators in parallel with each other in a same filter stage according to an embodiment.

FIG. 9 illustrates cross sectional schematic diagrams of two BAW resonators 112 and 114 that can be series resonators in parallel with each other in a same filter stage according to an embodiment. For example, a first BAW resonator 112 can correspond to the series acoustic wave resonator 14 of FIG. 7, and a second BAW resonator 114 can correspond to the series acoustic wave resonator 72 of FIG. 7. The second BAW resonator 114 is smaller than the first BAW resonator 112. The second BAW resonator 114 consumes less physical area than the first BAW resonator 112. The second BAW resonator 114 also includes a different frame structure than the first BAW resonator 112. The upper electrode can have a thickness that is the same or similar as the lower electrode 87. Although different mass loading is provided in different regions of the first BAW resonator 112 by the upper layer stack 115 in FIG. 9, one or more other layers embedded in a piezoelectric layer and/or below a piezoelectric layer can alternatively or additionally contribute to different mass loading in different regions of a BAW resonator.

As illustrated, the first BAW resonator 112 includes an upper layer stack 115, a piezoelectric layer 86, a lower electrode 87, an air cavity 88, and a support substrate 89. The upper layer stack 115 provides different mass loading in a main acoustically active region $MAIN_1$, a recessed frame region $ReF_1$, and a raised frame region $RaF_1$ of the first BAW resonator 112. There is more mass loading in the raised frame region $RaF_1$ than in the main acoustically active region $MAIN_1$. There is less mass loading in the recessed frame region $ReF_1$ than in the main acoustically active region $MAIN_1$. The upper layer stack 115 can include at least an upper electrode and a passivation layer.

As also illustrated in FIG. 9, the second BAW resonator 114 includes an upper layer stack 125, a piezoelectric layer 96, a lower electrode 97, an air cavity 98, and a support substrate 99. The BAW resonators 82 and 84 can be on a common die. The upper layer stack 125 provides different mass loading in a main acoustically active region $MAIN_2$, a recessed frame region $ReF_2$, and a raised frame region $RaF_2$ of the second BAW resonator 114. The upper layer stack 125 can include at least an upper electrode and a passivation layer. The upper electrode can have a thickness that is the same or similar as the lower electrode 97. Although different mass loading is provided in different regions of the second BAW resonator 114 by the upper layer stack 125 in FIG. 9, one or more other layers embedded in a piezoelectric layer and/or below a piezoelectric layer can alternatively or additional contribute to different mass loading in different regions of a BAW resonator.

The second BAW resonator 114 can have raised frame region $RaF_2$ sufficiently wide to boost Qp. The second BAW resonator 114 can have a wider raised frame region $RaF_2$ as a ratio of the total resonator width than the raised frame region $RaF_1$ of the first BAW resonator 112. The raised frame region $RaF_2$ of the second BAW resonator 114 can be wider than the raised frame region $RaF_1$ of the first BAW resonator 112. The second BAW resonator 114 can have a relatively narrow and/or shallow recessed frame region $ReF_2$. The second BAW resonator 114 can have a narrower and/or less deep recessed frame region than the first BAW resonator 112 in absolute width and/or as a percentage of total resonator width.

Acoustic wave filters disclosed herein can be arranged to filter a radio frequency signal. In certain applications, the acoustic wave filters can be band pass filters arranged to pass a radio frequency band and attenuate frequencies outside of the radio frequency band. Acoustic wave filters can implement band rejection filters. The principles and advantages disclosed herein can be implemented in a variety of different filter topologies. Example filter topologies include a ladder filter, a lattice filter, and a hybrid ladder lattice filter, and the like. In some applications, bulk acoustic wave resonators disclosed herein can be included in filter that also includes one or more inductors and one or more capacitors. For example, bulk acoustic wave resonators disclosed herein can be implemented in a filter that also includes a non-acoustic inductor-capacitor component.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to FIG. 3 and/or FIG. 7. The filter can be a band pass filter arranged to filter a fourth generation (4G) Long Term Evolution (LTE) band and/or a fifth generation (5G) New Radio (NR) band. Examples of a standalone filter and multiplexers will be discussed with reference to FIGS. 10A to 10E. Any suitable principles and advantages of these filters and/or multiplexers can be implemented together with each other.

Figure 10A:
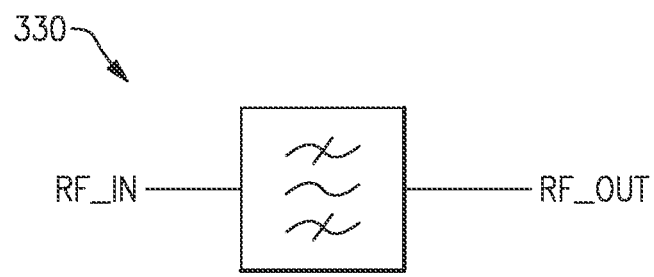
FIG. 10A is schematic diagram of an acoustic wave filter.

FIG. 10A is schematic diagram of an acoustic wave filter 330. The acoustic wave filter 330 is a band pass filter. The acoustic wave filter 330 is arranged to filter a radio frequency signal. The acoustic wave filter 330 includes a plurality of acoustic wave resonators coupled between a first input/output port RF_IN and a second input/output port RF_OUT. The acoustic wave filter 330 can be implemented in accordance with any suitable principles and advantages disclosed herein.

Figure 10B:
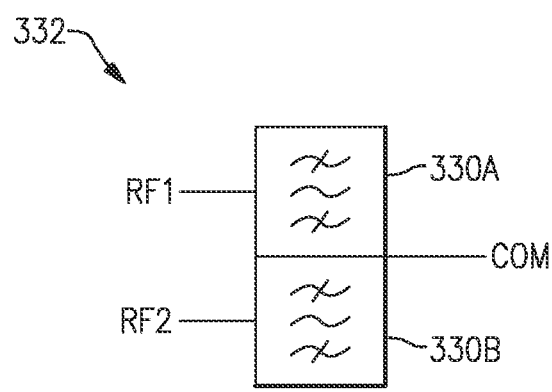
FIG. 10B is a schematic diagram of a duplexer that includes an acoustic wave filter according to an embodiment.

FIG. 10B is a schematic diagram of a duplexer 332 that includes an acoustic wave filter according to an embodiment. The duplexer 332 includes a first filter 330A and a second filter 330B coupled to together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes acoustic wave resonators coupled between a first radio frequency node RF1 and the common node COM. The first radio frequency node RF1 can be a transmit node or a receive node. The first filter 330A can be implemented in accordance with any suitable principles and advantages disclosed herein.

The second filter 330B can be any suitable filter arranged to filter a second radio frequency signal. The second filter 330B can be, for example, an acoustic wave filter, an acoustic wave filter in accordance with any suitable principles and advantages disclosed herein, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different pass bands. Multiplexers can include any suitable number of transmit filters and any suitable number of receive filters. For example, a multiplexer can include all receive filters, all transmit filters, or one or more transmit filters and one or more receive filters. One or more filters of a multiplexer can be implemented in accordance with any suitable principles and advantages disclosed herein.

Figure 10C:
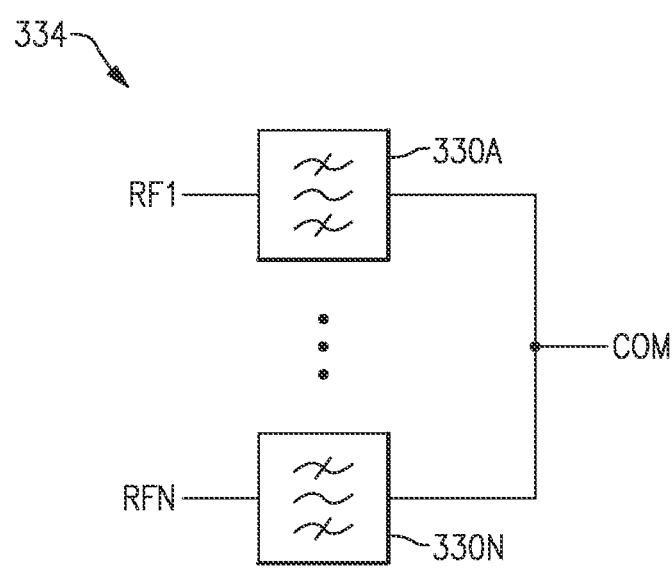
FIG. 10C is a schematic diagram of a multiplexer that includes an acoustic wave filter according to an embodiment.

FIG. 10C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Each of the filters 330A to 330N has a respective input/output node RF1 to RFN.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A can be implemented in accordance with any suitable principles and advantages disclosed herein. The other filter(s) of the multiplexer 334 can include one or more acoustic wave filters, one or more acoustic wave filters in accordance with any suitable principles and advantages disclosed herein, one or more LC filters, one or more hybrid acoustic wave LC filters, or any suitable combination thereof.

Figure 10D:
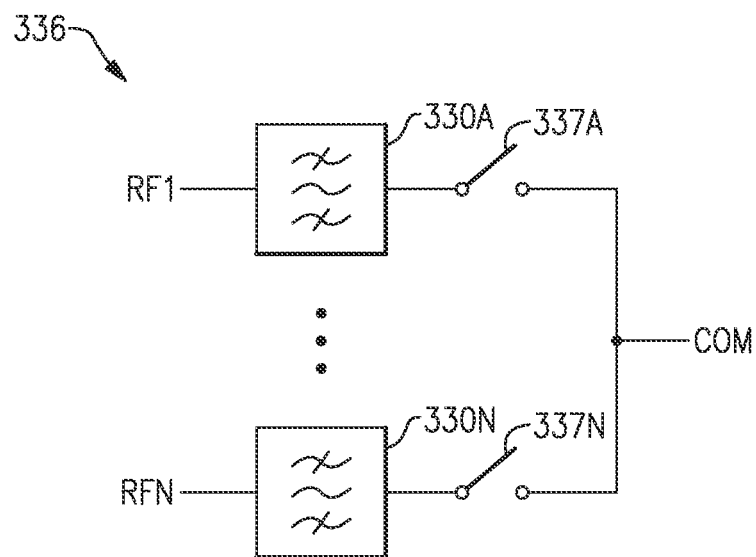
FIG. 10D is a schematic diagram of a multiplexer that includes an acoustic wave filter according to an embodiment.

FIG. 10D is a schematic diagram of a multiplexer 336 that includes an acoustic wave filter according to an embodiment. The multiplexer 336 is like the multiplexer 334 of FIG. 10C, except that the multiplexer 336 implements switched multiplexing. In switched multiplexing, a filter is coupled to a common node via a switch. In the multiplexer 336, the switches 337A to 337N can selectively electrically connect respective filters 330A to 330N to the common node COM. For example, the switch 337A can selectively electrically connect the first filter 330A to the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 10E:
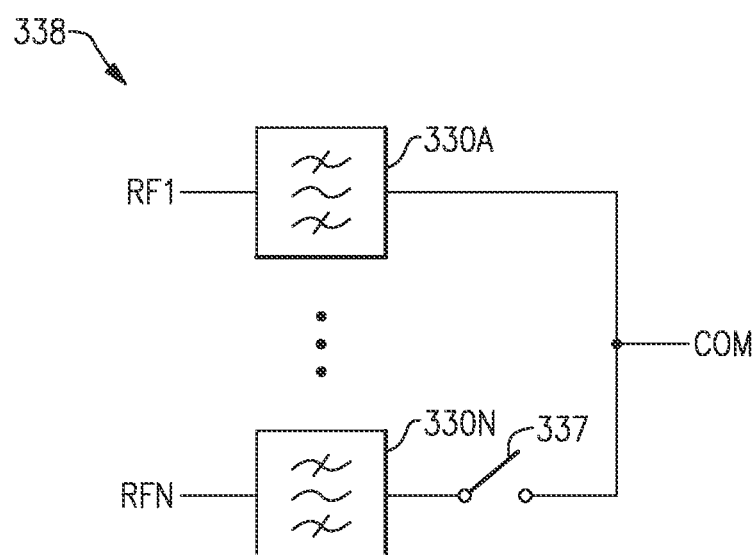
FIG. 10E is a schematic diagram of a multiplexer that includes an acoustic wave filter according to an embodiment.

FIG. 10E is a schematic diagram of a multiplexer 338 that includes an acoustic wave filter according to an embodiment. The multiplexer 338 illustrates that a multiplexer can include any suitable combination of hard multiplexed and switched multiplexed filters. Any suitable principles and advantages disclosed herein can be included in a filter that is hard multiplexed to the common node of a multiplexer. Alternatively or additionally, any suitable principles and advantages disclosed herein can be included in a filter that is switch multiplexed to the common node of a multiplexer.

Acoustic wave filters s disclosed herein can be implemented in a variety of packaged modules. Some example packaged modules will now be discussed in which any suitable principles and advantages of the acoustic wave filters disclosed herein can be implemented. Example packaged modules include one or more acoustic wave filters and one or more radio frequency amplifiers (e.g., one or more power amplifiers and/or one or more low noise amplifiers) and/or one or more radio frequency switches. The example packaged modules can include a package that encloses the illustrated circuit elements. The illustrated circuit elements can be disposed on a common packaging substrate. The packaging substrate can be a laminate substrate, for example. FIGS. 11 to 15 are schematic block diagrams of illustrative packaged modules according to certain embodiments. Any suitable combination of features of these packaged modules can be implemented with each other. While duplexers are illustrated in the example packaged modules of FIGS. 11 to 15, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 11:
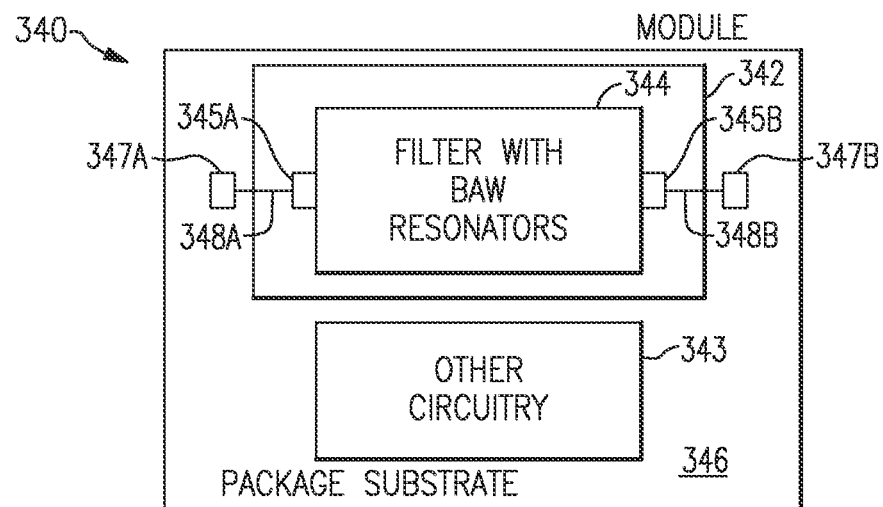
FIGS. 11, 12, 13, 14, and 15 are schematic block diagrams of illustrative packaged modules according to certain embodiments.

FIG. 11 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include an acoustic wave filter in accordance with any suitable combination of features disclosed herein. The acoustic wave component 342 can include a BAW die that includes BAW resonators.

The acoustic wave component 342 shown in FIG. 11 includes a filter 344 and terminals 345A and 345B. The filter 344 is implemented in accordance with any suitable principles and advantages disclosed herein. The terminals 345A and 344B can serve, for example, as an input contact and an output contact. The acoustic wave component 342 and the other circuitry 343 are on a common packaging substrate 346 in FIG. 11. The packaging substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 343 can be electrically connected to the filter 344. The radio frequency module 340 can include one or more packaging structures to, for example, provide protection and/or facilitate easier handling of the radio frequency module 340. Such a packaging structure can include an overmold structure formed over the packaging substrate 346. The overmold structure can encapsulate some or all of the components of the radio frequency module 340.

Figure 12:
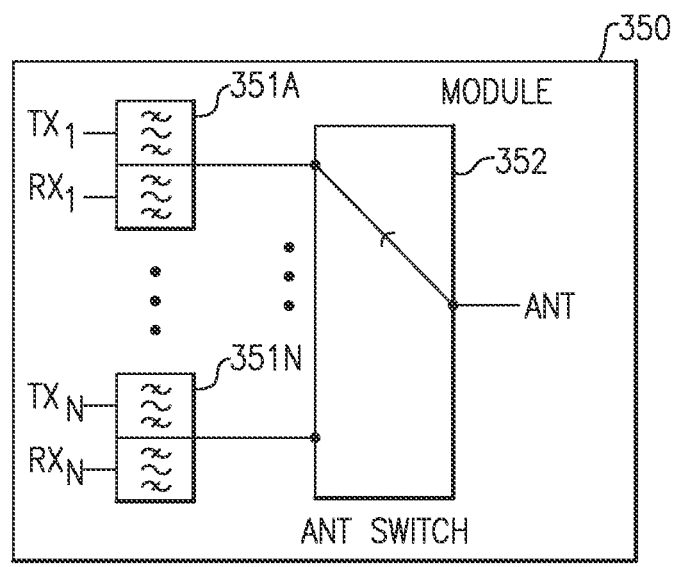

FIG. 12 is a schematic block diagram of a module 350 that includes multiplexers 351A to 351N and an antenna switch 352. The multiplexers 351A to 351N can include one or more duplexers. For example, as illustrated, the multiplexers 351A to 351N can be duplexers. One or more filters of the multiplexers 351A to 351N can be implemented in accordance with any suitable principles and advantages discussed herein. Any suitable number of multiplexers 351A to 351N can be implemented. The antenna switch 352 can have a number of throws corresponding to the number of multiplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350.

Figure 13:
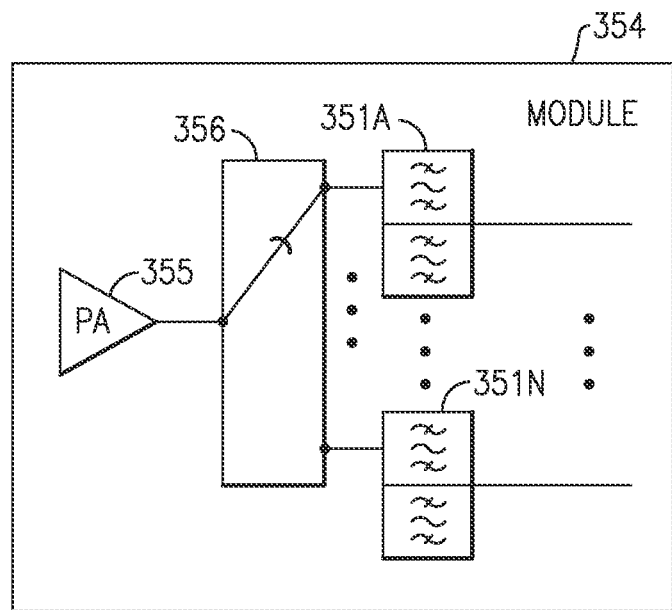

FIG. 13 is a schematic block diagram of a module 354 that includes a power amplifier 355, a radio frequency switch 356, and multiplexers 351A to 351N in accordance with one or more embodiments. The power amplifier 355 can amplify a radio frequency signal. The radio frequency switch 356 can be a multi-throw radio frequency switch. The radio frequency switch 356 can electrically couple an output of the power amplifier 355 to a selected transmit filter of the multiplexers 351A to 351N. One or more filters of the multiplexers 351A to 351N can be implemented in accordance with any suitable principles and advantages discussed herein. Any suitable number of multiplexers 351A to 351N can be implemented.

Figure 14:
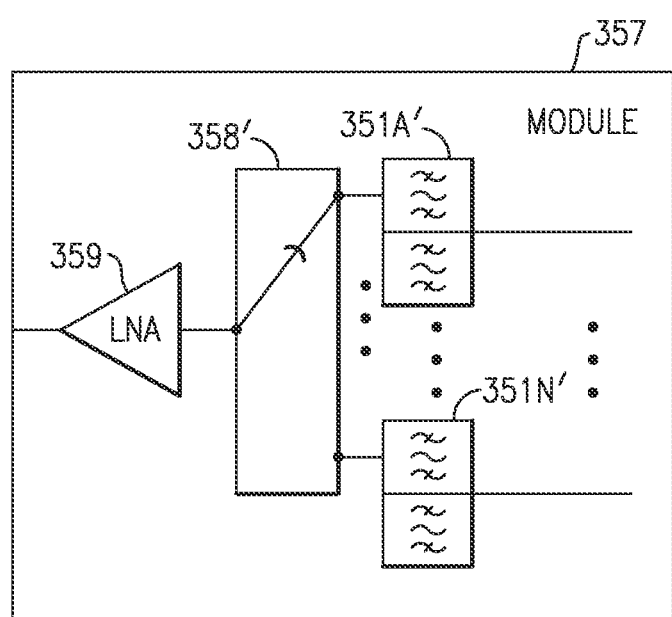

FIG. 14 is a schematic block diagram of a module 357 that includes multiplexers 351A' to 351N', a radio frequency switch 358, and a low noise amplifier 359 according to an embodiment. One or more filters of the multiplexers 351A' to 351N' can include be implemented in accordance with any suitable principles and advantages disclosed herein. Any suitable number of multiplexers 351A' to 351N' can be implemented. The radio frequency switch 358 can be a multi-throw radio frequency switch. The radio frequency switch 358 can electrically couple an output of a selected filter of multiplexers 351A' to 351N' to the low noise amplifier 359. In some embodiments (not illustrated), a plurality of low noise amplifiers can be implemented. The module 357 can include diversity receive features in certain applications.

Figure 15:
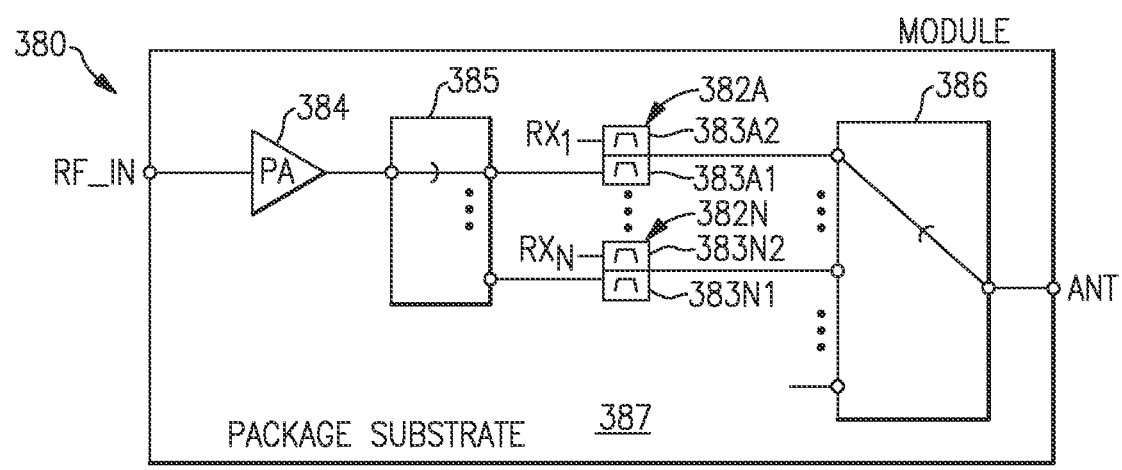

FIG. 15 is a schematic diagram of a radio frequency module 380 that includes an acoustic wave filter according to an embodiment. As illustrated, the radio frequency module 380 includes duplexers 382A to 382N that include respective transmit filters 383A1 to 383N1 and respective receive filters 383A2 to 383N2, a power amplifier 384, a select switch 385, and an antenna switch 386. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 15 and/or additional elements. The radio frequency module 380 may include one or more acoustic wave filters in accordance with any suitable principles and advantages disclosed herein.

The duplexers 382A to 382N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 383A1 to 383N1 can be implemented in accordance with any suitable principles and advantages disclosed herein. Similarly, one or more of the receive filters 383A2 to 383N2 can be implemented in accordance with any suitable principles and advantages disclosed herein. Although FIG. 15 illustrates duplexers, any suitable principles and advantages disclosed herein can be implemented in other multiplexers (e.g., quadplexers, hexaplexers, octoplexers, etc.) and/or in switched multiplexers.

The power amplifier 384 can amplify a radio frequency signal. The illustrated switch 385 is a multi-throw radio frequency switch. The switch 385 can electrically couple an output of the power amplifier 384 to a selected transmit filter of the transmit filters 383A1 to 383N1. In some instances, the switch 385 can electrically connect the output of the power amplifier 384 to more than one of the transmit filters 383A1 to 383N1. The antenna switch 386 can selectively couple a signal from one or more of the duplexers 382A to 382N to an antenna port ANT. The duplexers 382A to 382N can be associated with different frequency bands and/or different modes of operation (e.g., different power modes, different signaling modes, etc.).

Figure 16:
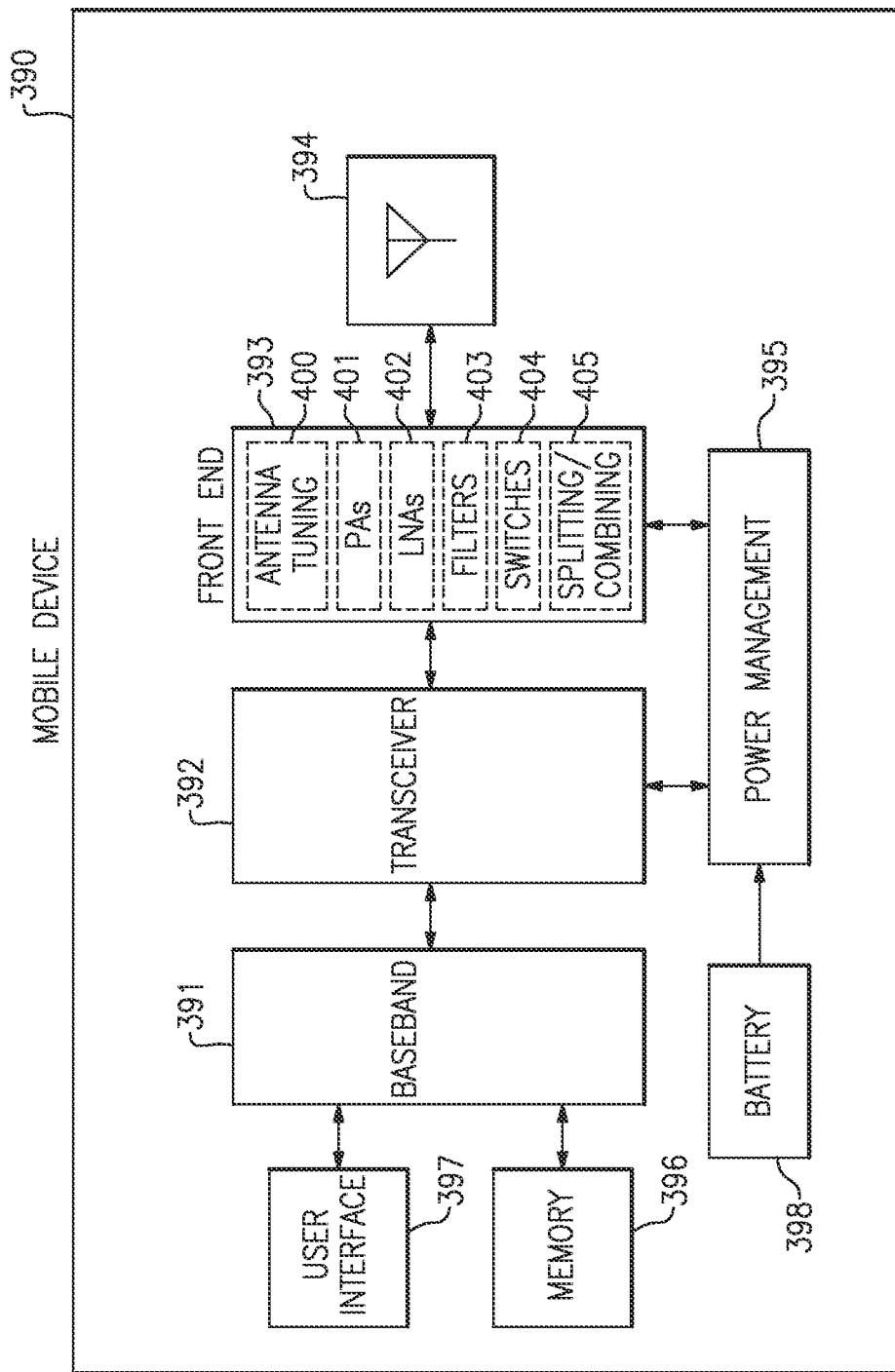
FIG. 16 is a schematic diagram of one embodiment of a mobile device.

Acoustic wave filters disclosed herein can be implemented in a variety of wireless communication devices, such as mobile devices. One or more filters implemented with any suitable principles and advantages disclosed herein can be included in a variety of wireless communication devices, such as mobile phones. The acoustic wave filter can be implemented in a radio frequency front end. FIG. 16 is a schematic diagram of one embodiment of a mobile device 390. The mobile device 390 includes a baseband system 391, a transceiver 392, a front end system 393, antennas 394, a power management system 395, a memory 396, a user interface 397, and a battery 398.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 16 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, and signal splitting/combining circuitry 405. However, other implementations are possible. One or more of the filters 403 can be implemented in accordance with any suitable principles and advantages disclosed herein.

The front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 16, the baseband system 391 is coupled to the memory 396 to facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 16, the power management system 395 receives a battery voltage from the battery 398. The battery 398 can be any suitable battery for use in the mobile device 390, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave filter including any suitable combination of features disclosed herein can be arranged to filter a radio frequency signal in a 5G NR operating band within Frequency Range 1 (FR1). FR1 can be from 410 MHz to 7.125 GHz, for example, as specified in a current 5G NR specification. An acoustic wave filter in accordance with any suitable principles and advantages disclosed herein can be arranged to filter a radio frequency signal in a fourth generation (4G) Long Term Evolution (LTE). An acoustic wave filter in accordance with any suitable principles and advantages disclosed herein can have a pass band that includes a 4G LTE operating band and a 5G NR operating band. Such a filter can be implemented in a dual connectivity application, such as an E-UTRAN New Radio-Dual Connectivity (ENDC) application.

Acoustic wave filters disclosed herein can provide better power ruggedness in a pass band near an edge of a band pass filter while providing a steep filter skirt. Such features can be advantageous in 5G NR applications with stringent ruggedness specifications and steep filter skirt specifications. For example, such acoustic wave filters can provide a steep filter skirt for 5G NR applications. At the same time, the acoustic wave filters can have desirable power ruggedness in a channel near a band edge for meeting 5G NR performance specifications at the filter level and/or at the system level. Acoustic filters disclosed herein can provide relatively wide bandwidth with relatively low non-linearities. This is generally desirable for 5G NR applications. There can also be less temperature variation for acoustic filters disclosed herein compared to certain conventional acoustic filter topologies.

Figure 17:
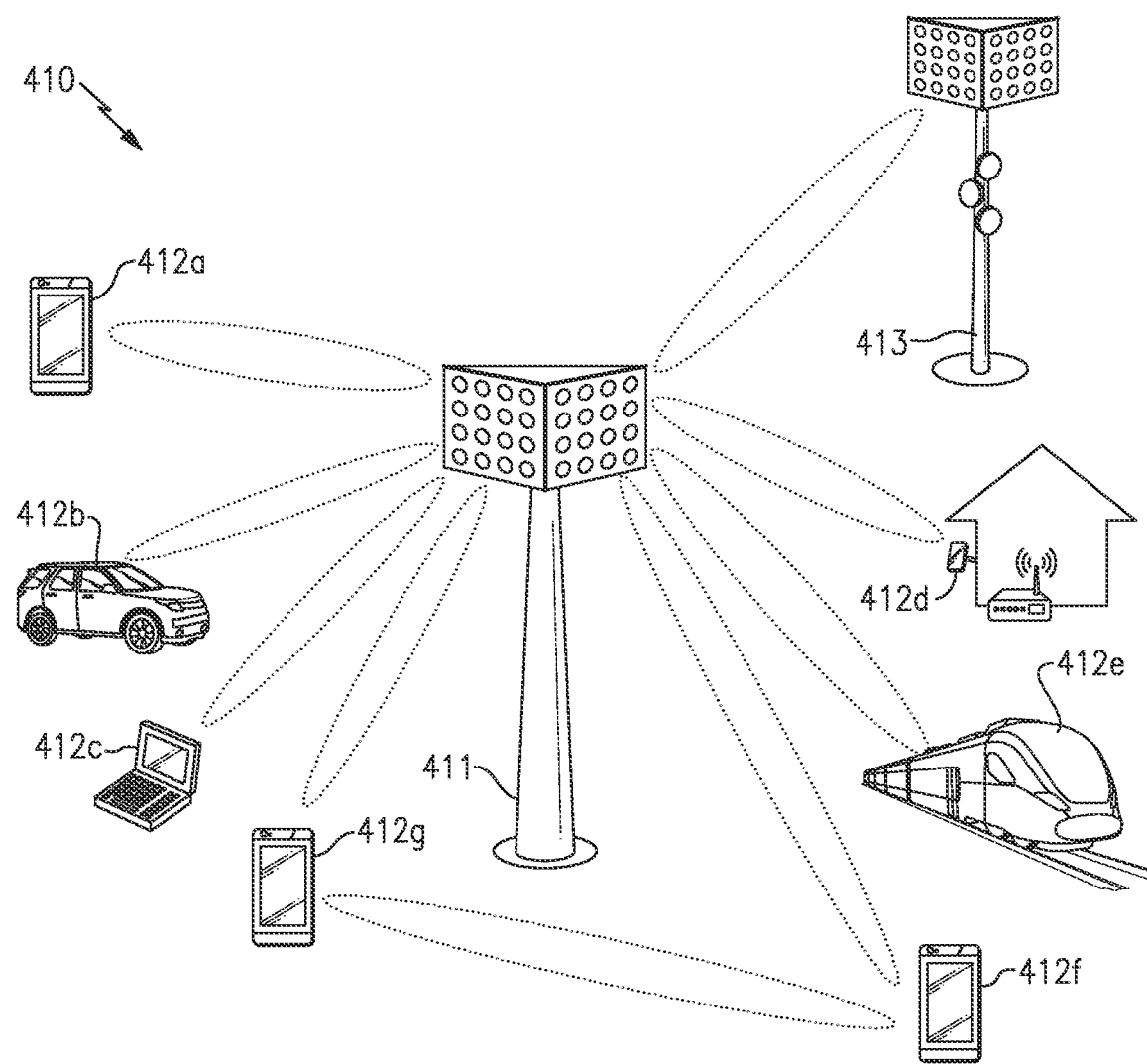
FIG. 17 is a schematic diagram of one example of a communication network.

FIG. 17 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 141, the small cell base station 413, or UEs illustrated in FIG. 17 can implement one or more of the acoustic wave filters in accordance with any suitable principles and advantages disclosed herein. For example, one or more of the UEs shown in FIG. 17 can include one or more acoustic wave filters in accordance with any suitable principles and advantages disclosed herein.

Although specific examples of base stations and user equipment are illustrated in FIG. 17, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 17 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 17. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 17, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 17 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 450 MHz to 8.5 GHz or in a frequency range from about 450 MHz to 10 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively.

While certain embodiments have been described, these embodiments have been presented by way of example only, and are not intended to limit the scope of the disclosure. Indeed, the novel acoustic filters described herein may be embodied in a variety of other forms. Furthermore, various omissions, substitutions, and changes in the form of the acoustic filters described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter comprising:
   a plurality of shunt acoustic wave resonators; and
   a plurality of series acoustic wave resonators including a first bulk acoustic wave resonator and
   a second bulk acoustic wave resonator,
   the plurality of series acoustic wave resonators and the plurality of shunt acoustic wave resonators together arranged as a band pass filter with a pass band,
   the second bulk acoustic wave resonator is configured to contribute to forming a lower edge of the pass band,
   the first bulk acoustic wave resonator and the second bulk acoustic wave resonator are in parallel with each other, and
   the second bulk acoustic wave resonator is smaller than the first bulk acoustic wave resonator.

2. The acoustic wave filter of claim 1 wherein the first bulk acoustic wave resonator and the second bulk acoustic wave resonator each include a raised frame, the raised frame of the second bulk acoustic wave resonator is wider as a percentage of total resonator width than the raised frame of the first bulk acoustic wave resonator.

3. The acoustic wave filter of claim 1 wherein the first bulk acoustic wave resonator and the second bulk acoustic wave resonator each include a recessed frame, the recessed frame of the second bulk acoustic wave resonator is narrower as a percentage of total resonator width than the recessed frame of the first bulk acoustic wave resonator.

4. The acoustic wave filter of claim 1 wherein the second bulk acoustic wave resonator does not include a recessed frame.

5. The acoustic wave filter of claim 4 wherein the first bulk acoustic wave resonator includes a recessed frame.

6. The acoustic wave filter of claim 1 wherein a resonant frequency of the second bulk acoustic wave resonator is lower than the lower edge of the pass band.

7. The acoustic wave filter of claim 1 wherein the second bulk acoustic wave resonator is configured to increase power ruggedness of the acoustic wave filter in the pass band.

8. The acoustic wave filter of claim 1 wherein the first bulk acoustic wave resonator has an area that is at least 1.5 times an area of the second bulk acoustic wave resonator.

9. The acoustic wave filter of claim 1 wherein the first bulk acoustic wave resonator has an area in a range from 1.5 to 15 times an area of the second bulk acoustic wave resonator.

10. The acoustic wave filter of claim 1 wherein the second bulk acoustic wave resonator is a film bulk acoustic wave resonator.

11. An acoustic wave filter comprising:
    a plurality of shunt acoustic wave resonators; and
    a plurality of series acoustic wave resonators including a first bulk acoustic wave resonator and
    a second bulk acoustic wave resonator,
    the second bulk acoustic wave resonator together with at least one of the plurality of shuntacoustic wave resonators configured to contribute to forming a skirt of the acoustic wave filter,
    the first bulk acoustic wave resonator and the second bulk acoustic wave resonator being in parallel with each other, and
    the second bulk acoustic wave resonator being smaller than the first bulk acoustic wave resonator.

12. The acoustic wave filter of claim 11 wherein the first bulk acoustic wave resonator and the second bulk acoustic wave resonator each include a raised frame, and the raised frame of the second bulk acoustic wave resonator is wider as a percentage of total resonator width than the raised frame of the first bulk acoustic wave resonator.

13. The acoustic wave filter of claim 12 wherein the first bulk acoustic wave resonator and the second bulk acoustic wave resonator each include a recessed frame, and the recessed frame of the second bulk acoustic wave resonator is narrower as a percentage of total resonator width than the recessed frame of the first bulk acoustic wave resonator.

14. The acoustic wave filter of claim 12 wherein the second bulk acoustic wave resonator does not include a recessed frame.

15. The acoustic wave filter of claim 14 wherein the first bulk acoustic wave resonator includes a recessed frame.

16. The acoustic wave filter of claim 11 wherein the acoustic wave filter is a band pass filter having a pass band, and the skirt corresponds to a lower edge of the pass band.

17. The acoustic wave filter of claim 16 wherein the second bulk acoustic wave resonator is configured to increase power ruggedness of the acoustic wave filter in the pass band.

18. The acoustic wave filter of claim 11 wherein the acoustic wave filter is a band stop filter with a stop band, and the skirt corresponds to an upper edge of the stop band.

19. The acoustic wave filter of claim 11 wherein the first bulk acoustic wave resonator has an area in a range from 1.5 to 15 times an area of the second bulk acoustic wave resonator.

20. A wireless communication device comprising:
    an acoustic wave filter including plurality of shunt acoustic wave resonators and a plurality of series acoustic wave resonators together arranged as a band pass filter with a pass band,
the plurality of series acoustic wave resonators including a first bulk acoustic wave resonator and a second bulk acoustic wave resonator,
the second bulk acoustic wave resonator is configured to contribute to forming a lower edge of the pass band,
the first bulk acoustic wave resonator and the second bulk acoustic wave resonator are in parallel with each other, and
the second bulk acoustic wave resonator is smaller than the first bulk acoustic wave resonator; and
an antenna operatively coupled to the acoustic wave filter.

* * * * *